United States Patent [19]

Iwasaki

[11] 4,320,308
[45] Mar. 16, 1982

[54] PULSE DUTY CONTROL SYSTEM

[75] Inventor: Shinichiro Iwasaki, Auburn Heights, Mich.

[73] Assignee: Aisin Seiki Company, Limited, Kariya, Japan

[21] Appl. No.: 182,675

[22] Filed: Aug. 29, 1980

[51] Int. Cl.³ ............................ H03K 3/00; H02J 7/00
[52] U.S. Cl. ........................................ 307/106; 320/64
[58] Field of Search ................. 307/106, 108; 320/64, 320/67, 68; 324/117 R; 164/5

[56] References Cited

U.S. PATENT DOCUMENTS

| | | | |
|---|---|---|---|
| 3,855,528 | 12/1974 | Brown | 324/117 |
| 3,904,948 | 9/1975 | Earle | 320/64 |
| 3,942,096 | 3/1976 | Itoh et al. | 320/64 |
| 4,155,397 | 5/1979 | Honsinger et al. | 164/5 |
| 4,258,307 | 3/1981 | Mori et al. | 320/64 |

Primary Examiner—Russell E. Adams
Attorney, Agent, or Firm—Oblon, Fisher, Spivak, McClelland & Maier

[57] ABSTRACT

A pulse duty control system comprises a pulse duty controlling element including a core made of an amorphous, magnetically soft material having a first and a second coil disposed thereon. A first set of pulses are applied to one end of the first coil while a second set of pulses, which are phase displaced by 180° from the first set of pulses, are applied to one end of the second coil. The other end of the first coil is connected to an output terminal while the other end of the second coil is connected to a current controlling transistor, the base of which is connected to control circuit means. An output pulse, which is developed at the other end of the first coil, has a rising edge which lags behind the rising edge of a pulse of the first set of pulses by a time delay corresponding to the degree of conduction of the transistor which in turn depends on an output voltage from the control circuit means. The output pulse has a falling edge which is substantially synchronized with that of the pulse in the first set of pulses.

9 Claims, 5 Drawing Figures

PULSE DUTY CONTROL SYSTEM

BACKGROUND OF THE INVENTION

1. Field of the Invention

The present invention relates in general to a novel current or a novel voltage pulse duty control system and, in particular, to a novel pulse duty control system including a pulse duty controlling element formed by a core made of a magnetically soft material which carries a first electrical coil for converting an input pulse into a duty controlled pulse and a second electrical coil which controls the duty cycle.

2. Description of the Prior Art

A conventional pulse duty control system is constructed utilizing a pulse width modulation (PWM) electronic circuit. This system additionally requires a power amplifier for relatively high power controlling applications, such as for the constant voltage control of a power supply or motor speed control, in addition to the disadvantage of requiring an increased number of circuit elements. For applications such as controlling a vehicle power supply or a motor, this control system must be located at a vibration-free place which is removed from the apparatus being controlled in order to prevent damage or malfunctioning due to vibrations or noises.

SUMMARY OF THE INVENTION

It is a first object of the present invention to provide a novel pulse duty control system having a reduced number of electronic circuit elements.

A second object of the present invention is to provide a novel pulse duty control system capable of controlling relatively high power with a reduced number of electronic elements.

A third object of the present invention is to provide a novel pulse control system having vibration and noise resistance which can be located adjacent to an apparatus being controlled.

The above objects are achieved in accordance with the present invention by utilizing a core made of an amorphous magnetically soft material as a duty controlling element. The core carries a first electrical coil which converts an input pulse into a duty controlled pulse and a second duty controlling electrical coil. A pulse voltage is applied to one end of the first electrical coil through a first switching circuit, which effects a chopping operation in synchronism with a reference pulse. The other end of the first electrical coil is connected to an output terminal. One end of the second electrical coil is connected to a current controlling element which is fed with a control voltage from a control circuit means. The application of a voltage to the second electrical coil is phase displaced by 180° with respect to the application of a voltage to the first electrical coil, by utilizing a second switching circuit which is turned on and off in synchronism with the reference pulse. The impedance or the degree of conduction of the current controlling element is determined by the level of the control voltage outputed from the control circuit means while a current pulse appearing at the output terminal has a duty ratio which corresponds to the degree of conduction.

The core of amorphous magnetically soft material is provided in the form of thin sheets since it must be manufactured by quenching from a liquid metal. Magnetically, such material is ferromagnetic and exhibits a high permeability ($\mu$max$>10^3$), a low level of magnetic saturation, and a low coercive force ($<1.0$ $O_E$). Mechanically, it has a very high fracture strength and excellent resilience and stability. Such magnetically soft materials are described in Hasegawa et al, "Soft Magnetic Properties of Metallic Glasses—Recent Developments", J. Appl. Phys. 50(3), March, 1979, PP. 1551-1556. Magnetically soft materials are sold under the trademarks METGLAS (TM) by Allied Chemical Corp.

The use of such amorphous magnetically soft material as the core of the duty controlling element facilities the manufacture of the element which, in addition, has high vibration and impact resistance. Of particular importance is the fact that the duty controlling element is capable of achieving control of any desired power level through a suitable choice of the size, and the output of the duty controlling element can be directly used to energize an apparatus, circuit, or the like.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1:
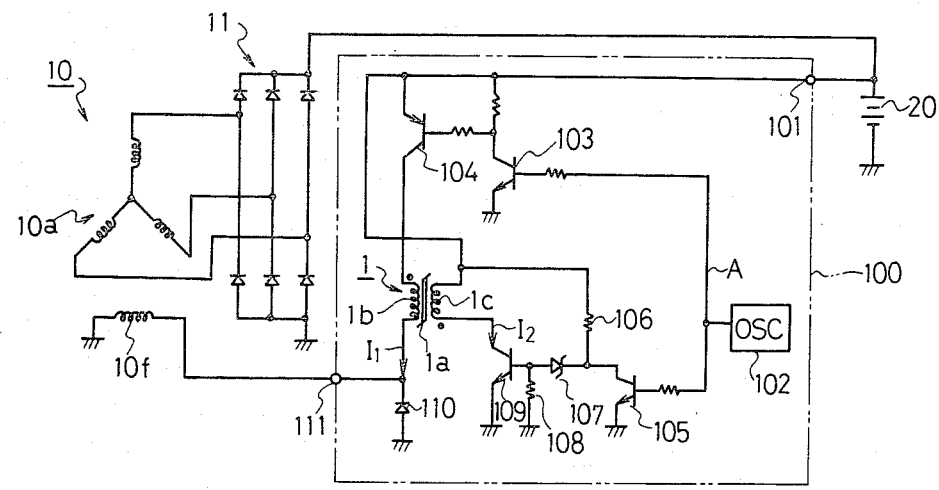
FIG. 1 is a circuit diagram of an embodiment of the present invention.

Referring now to the drawings, wherein like reference numerals designate identical or corresponding parts throughout the several views, and more particularly to FIG. 1 thereof, an embodiment of the present invention is shown which is utilized as a battery charging control system. Specifically, there is provided a generator 10 including an armature winding 10a and a field winding 10f. An output of the generator is subjected to full wave rectification by a diode bridge 11 to charge a battery 20. A pulse duty control system 100, according to the present invention, is used to control the field current supplied to the battery charging system.

Referring to FIG. 1, a power input terminal 101 is connected to the positive terminal of the battery 20, and a first switching circuit, formed by an NPN transistor 103 and a PNP transistor 104, is connected with the power input terminal 101. The transistor 104 has its emitter connected to the terminal 101 and its collector connected to one terminal of a first electrical coil 1b of a pulse duty controlling element 1. The element 1 also includes a second electrical coil 1c which has a terminal connected to the supply terminal 101, and which has its other terminal connected to an NPN transistor 109, functioning as a current controlling element. A combination of a resistor 106, a Zener diode 107, and another resistor 108, connected in series with the supply terminal 101, forms a control circuit means. The junction between the anode of the Zener diode 107 and the resistor 108 is connected to the base of the NPN transistor 109. The voltage supplied by the battery 20 to the supply terminal 101 normally exceeds the breakdown voltage of the Zener diode 107, which therefore normally breaks down. Therefore, the voltage developed across the resistor 108, or the base voltage of the transistor 109, corresponds to the battery voltage. Consequently, when the battery voltage is high, the transistor 109 exhibits a higher degree of conduction to increase the level of a current $I_2$ which passes through the second coil. When the battery voltage is low, the level of the current $I_2$ is reduced. The junction between the cathode of the Zener diode 107 and the resistor 106 is connected to the collector of an NPN transistor 105 which forms a second switching circuit. The base of both transistors 103, 105 is fed with an output pulse A from a pulse generator 102.

Figure 2A:
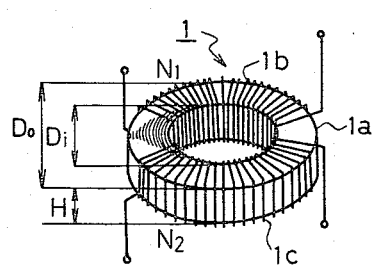
FIG. 2a is a perspective view illustrating the pulse duty controlling element shown in FIG. 1.
Figure 2B:
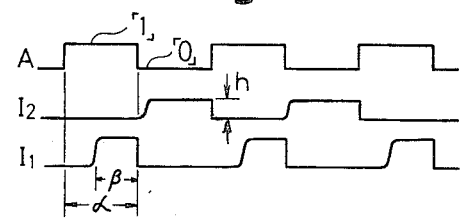
FIG. 2b is a series of timing charts indicating the relative timing of a reference pulse A, a control current $I_1$, and an output current $I_2$, used in the circuit shown in FIG. 1.

An enlarged perspective view of the pulse duty controlling element 1 is shown in FIG. 2a. It includes a ring-shaped core 1a, which is formed by a spiral winding of an amorphous magnetically soft material, having first and second electrical coils 1b, 1c disposed thereon. FIG. 2b shows the relative timing of the output pulse A from the pulse generator 102 and the currents $I_1$ and $I_2$ flowing through the first and the second electrical coils 1b and 1c, respectively. Describing the operation of the circuit shown in FIG. 1 with reference to FIG. 2b, when the pulse A assumes a high level or "1", the transistors 103 and 105 are both on. This turns the transistor 104 on while the transistor 109 is turned off since the cathode of the Zener diode 107 assumes a ground level. When the pulse A changes to a low level or "0", both transistors 104 and 105 are turned off while the transistor 109 is turned on. The degree of conduction of transistor 109 corresponds to the current flow through the resistor 106 which depends on the voltage across the battery 20. The current $I_2$ produces a magnetic field which reduces the flux created in the core 1a by the current $I_1$ when the pulse A assumes "1" level. The current $I_2$ has a pulse height h which corresponds to the source voltage. The time interval $\alpha$-$\beta$ from the rising edge of the pulse A until the current $I_1$ begins to flow corresponds to the remanent flux in the core 1a. The time interval will be reduced for a greater remnant flux, and increases for a reduced remnant flux. On the other hand, the magnitude of the remanent flux will be small for a greater magnitude of the current $I_2$ and has an increased value for a reduced magnitude of the current $I_2$. Therefore, the time delay $\alpha$-$\beta$ has a greater value for a higher degree of condsction of the transistor 109, and has a reduced value for a lower degree of conduction of the transistor 109. Consequently, the time delay $\alpha$-$\beta$ has a greater value and the pulse duty ratio $\beta/2\alpha$ has a reduced value for a higher battery voltage while the time delay $\alpha$-$\beta$ is reduced and the pulse duty ratio $\beta/2\alpha$ increases for a lower battery voltage. The described operation allows for the field winding 10f of the generator 10 to be energized with the current $I_1$ which has a reduced duty ratio $\beta/2\alpha$ when the battery voltage or the voltage at the supply terminal 101 is high and which has a greater ratio $\beta/2\alpha$ when the battery voltage is low. It will be understood that when the field winding 10f is connected to the output terminal 111 as shown in FIG. 1, its inductance has a smoothing effect upon the current $I_2$, which then becomes a gradually varying pulsating current.

Figure 3:
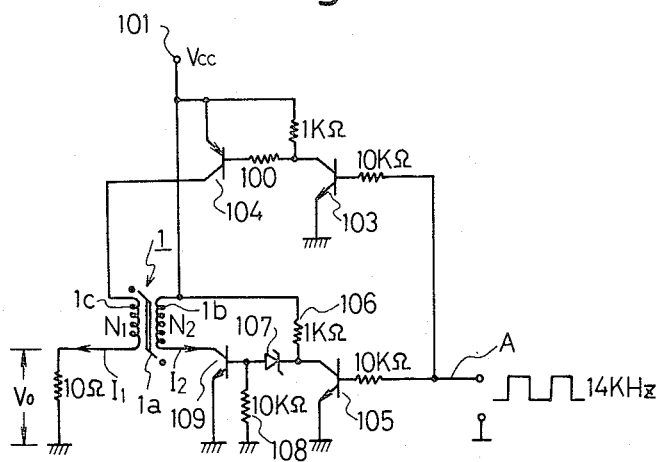
FIG. 3 is a circuit diagram of an arrangement which is used to obtain experimental data.

Using an experimental circuit shown in FIG. 3 in which the field winding is replaced by a 10 ohm resistor and the supply terminal 101 is connected with a variable voltage source, the inventor of the present invention has determined the duty ratio of the output current pulse $I_1$ or a voltage pulse $V_O$ across the resistor of 10 ohms for a pulse A of 14 kHz. The material and dimensions of the duty controlling element 1 used are shown in the Table 1 below while the resulting data is graphically illustrated in FIG. 4. The Zener diode 107 used has a Zener voltage rating of eleven volts.

TABLE 1

| material & dimensions of core 1a of duty controlling elements 1, 2 | | | | coil 1b | coil 1c |
|---|---|---|---|---|---|
| material | configuration | | | | |
| (Atomic Weight %) $Fe_{40}Ni_{38}Mo_4B_{18}$ amorphous alloy sheet, thickness = 0.050 mm | laminated ring core of 110 sheets (FIG. 2a) | | | 50 turns | 40 turns |
| | Di(mm) 6 | Do(mm) 12 | H(mm) 2 | | |

Figure 4:
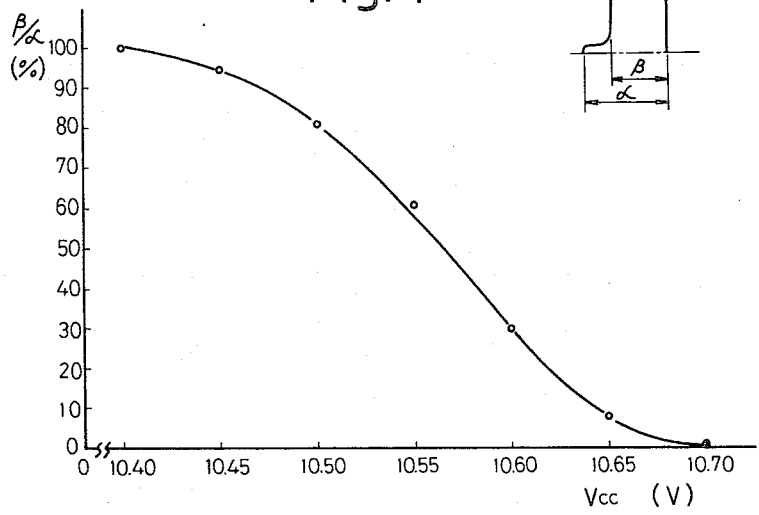
FIG. 4 graphically illustrates data obtained using the circuit shown in FIG. 3.

The data shown in FIG. 4 reveals that the current $I_1$ flows through the full "1" level interval of the pulse A for a source voltage (Vcc) of 10.40 V, and is substantially zero for Vcc of 10.70 V. The current $I_1$ varies through its full range for a 300 mV range of Vcc from 10.40 to 10.70 V. With this experimental circuit, the output current $I_1$ has a conduction angle of 180° (an interval corresponding to "1" level of the pulse A) for Vcc not greater than 10.40 V, and has a conduction angle less than 180° which varies with the magnitude of Vcc above 10.40 V and below 10.70 V. At Vcc above 10.70 V. the current $I_1$ has a conduction angle of zero (off). The voltage range of Vcc over which the conduction angle of the current $I_1$ can be controlled depends on the cathode voltage of Zener diode 107. Consequently, the operating range may be adjusted by connecting a variable resistor (not shown) between the cathode of the Zener diode 107 and ground.

A conventional transistorized voltage regulator utilizes a comparison of a generated voltage against a reference voltage across a Zener diode, with a difference signal being fed to turn a transistor on and off which controls the current supply to a field coil. However, the transistor may assume a condition between cut-off and full conduction, with the consequence that the resulting current flow produces an increased amount of heat, thereby reducing the useful life of the transistor.

With the circuit shown in FIG. 1, the transistor 104, which is directly connected in the energizing circuit for the field coil, performs a simple switching operation. This reduced the above-described loss. Since the duty control is achieved by resetting the flux in the core 1a, a complex duty control as found in the usual duty control circuit is avoided. What is required is to control the degree of conduction of the transistor 109 in an analog manner depending on the magnitude of the voltage generated. Since the transistor 109 operates in a region of stable operation, any operational instability is avoided, resulting in increased reliability. Since the circuit of the invention is entirely formed of highly reliable discrete elements (transistors), it is capable of operting with high reliability in an adverse environment, in particular, in an engine compartment of a vehicle where high temperatures prevail.

By using an amorphous, magnetically soft material for the core, its low coercive force, high electrical resistivity, and the configuration in the form of a thin sheet cooperate to minimize hysteresis losses and eddy current losses while the high saturated flux density permits a reduction in the size of the core. The choice of a higher switching frequency further reduces the core size and the number of turns in the coil, thus reducing the copper loss. Consequently, the entire circuit can fit in a practically feasible space even though a magnetic core is used in the circuit.

Obviously, numerous additional modifications and variations of the present invention are possible in light of the above teachings. It is therefore to be understood that within the the scope of the appended claims, the invention may be practiced otherwise than as specifically described herein.

What is claimed as new and desired to be secured by letters patent of the United States is:

1. A pulse duty control system, comprising:
    a pulse duty controlling element including a core made of an amorphous magnetically soft material having a first and a second electrical coil disposed thereon, said first electrical coil having a first terminal coupled to an output terminal of said system, said second electrical coil having a first terminal coupled to a first terminal of a voltage source;
    pulse generator means for producing a pulse signal of a given frequency;
    current controlling means coupled to a second terminal of said second electrical coil for controlling a current flowing through said second electrical coil;
    control circuit means for applying a control voltage to said current controlling means, said control voltage controlling the amplitude of said current flowing through said second electrical coil;
    a first switching circuit coupled to a second terminal of said first electrical coil, said first switching circuit having an input coupled to receive said pulse signal from said pulse generator means, said first switching circuit allowing a current to flow through said first electrical coil during a portion of a first half-period of said pulse signal;
    a second switching circuit coupled to said current controlling means, said second switching circuit having an input coupled to receive said pulse signal produced by said pulse generator means, said second switching circuit allowing said current to flow through said second electrical coil during a portion of a second half-period of said pulse signal.

2. A pulse duty control system as recited in claim 1, wherein said core of said pulse duty controlling element comprises:
    a ring-shaped laminated core, said laminated core including a spiral winding of a thin sheet of said amorphous magnetically soft material.

3. A pulse duty control system as recited in claim 1, wherein said current controlling means comprises:
    a transistor coupled to said second terminal of said second electrical coil, said transistor having a base coupled to said control circuit means.

4. A pulse duty control system as recited in claim 1, wherein said current controlling means comprises:
    a transistor coupled to said second terminal of said second electrical coil, said transistor having a base coupled to said second switching circuit.

5. A pulse duty control system as recited in claim 3, wherein said control circuit means comprises:
    a first resistor having a first terminal coupled to said first terminal of said voltage source;
    a Zener diode having a cathode coupled to a second terminal of said first resistor, said Zener diode having an anode coupled to said base of said transistor; and
    a second resistor coupled between said base of said transistor and a second terminal of said voltage source.

6. A pulse duty control system as recited in claim 5, wherein:
    said cathode of said Zener diode is coupled to said second switching circuit.

7. A pulse duty control system, comprising:
    a pulse duty controlling element including a core made of an amorphous magnetically soft material having a first and a second electrical coil disposed thereon, said first electrical coil having a first terminal coupled to an output terminal of said system, said second electrical coil having a first terminal coupled to a first terminal of a power supply;
    pulse generator means for producing a pulse signal of a given frequency;
    a first transistor coupled to a second terminal of said second electrical coil;
    control circuit means for controlling the amplitude of a current flowing through said first transistor, said control circuit means including a first resistor having a first terminal coupled to said first terminal of said power supply, a Zener diode having a cathode terminal coupled to a second terminal of said resistor and an anode terminal coupled to a base of said first transistor, and a second resistor having a first terminal coupled to said base of said first transistor and a second terminal coupled to a second terminal of said power supply;
    a switching circuit coupled between said first terminal of said power supply and a second terminal of said first electrical coil, said switching circuit including an input coupled to said pulse generator means, said switching circuit being rendered conductive during a portion of a first half-period of said pulse signal produced by said pulse generator means; and
    a second transistor coupled to said cathode terminal of said Zener diode, said second transistor having a base coupled to said pulse generator means, said second transistor being rendered conductive during said first half-period of said pulse signal produced by said pulse generator means, said first transistor being rendered conductive during a portion of a second half-period of said pulse signal produced by said pulse generator means.

8. A pulse duty control system as recited in claim 7, wherein:
    said switching circuit includes a third transistor coupled between said first terminal of said power supply and said second terminal of said first electrical coil, said third transistor being a PNP transistor, said switching circuit further including a fourth transistor coupled to a base of said third transistor, said fourth transistor having a base coupled to said pulse generator means; and
    said first, second, and fourth transistor are NPN transistors.

9. A pulse duty control system as recited in claim 7, wherein said core of said pulse duty controlling element comprises:
    a ring-shaped laminated core, said laminated core including a spiral winding of a thin sheet of said amorphous magnetically soft material.

* * * * *